(12) United States Patent
Lin et al.

(10) Patent No.: US 8,665,651 B1
(45) Date of Patent: Mar. 4, 2014

(54) REFERENCE CELL CIRCUIT AND METHOD OF PRODUCING A REFERENCE CURRENT

(75) Inventors: Chi-Shun Lin, Fremont, CA (US); Seow-Fong Lim, Fremont, CA (US); Ming-Huei Shieh, Cupertino, CA (US)

(73) Assignee: Winbond Electronics Corp., Taichung (TW)

( * ) Notice: Subject to any disclaimer, the term of this patent is extended or adjusted under 35 U.S.C. 154(b) by 10 days.

(21) Appl. No.: 13/610,448

(22) Filed: Sep. 11, 2012

(51) Int. Cl.
*G11C 11/34* (2006.01)
*G11C 16/06* (2006.01)
*G11C 7/00* (2006.01)
*G11C 7/02* (2006.01)

(52) U.S. Cl.
USPC ............. 365/185.2; 365/185.21; 365/191; 365/210.1

(58) Field of Classification Search
USPC .......... 365/185.01, 185.2, 185.21, 191, 210.1
See application file for complete search history.

(56) References Cited

U.S. PATENT DOCUMENTS

| | | | |
|---|---|---|---|
| 6,327,184 B1 * | 12/2001 | Micheloni et al. | 365/185.2 |
| 2005/0213387 A1 * | 9/2005 | Kubo et al. | 365/185.21 |
| 2011/0188316 A1 * | 8/2011 | Maruyama et al. | 365/185.21 |
| 2013/0235649 A1 * | 9/2013 | Lindstadt et al. | 365/148 |

\* cited by examiner

*Primary Examiner* — Ly D Pham
(74) *Attorney, Agent, or Firm* — Muncy, Geissler, Olds & Lowe, P.C.

(57) ABSTRACT

The present invention discloses a reference cell circuit which is applied to a non-volatile memory. The reference cell circuit includes a reference cell array, a first current mirror circuit, and a second current mirror circuit. The reference cell array includes at least one row of floating gate transistors. The first current mirror circuit is arranged to generate a mirror current according to a reference current generated by the reference cell array. The second current mirror circuit is arranged to receive the mirror current and generate an adjusted reference current according to the mirror current and a selected one of a plurality of enable signals, wherein the plurality of enable signals correspond to a plurality operations of the non-volatile memory and the adjusted reference current is arranged to determine logical state of a plurality of memory cells of the non-volatile memory.

21 Claims, 4 Drawing Sheets

REFERENCE CELL CIRCUIT AND METHOD OF PRODUCING A REFERENCE CURRENT

BACKGROUND OF THE INVENTION

1. Field of the Invention

The present invention relates to a reference cell circuit, and in particular relates to a reference cell circuit including a plurality of the floating gate transistors with ultraviolet threshold voltage.

2. Description of the Related Art

The electrically erasable and programmable non-volatile memory device stores data bits in floating gate type field effect transistors. The floating gate type field effect transistor has a floating gate electrode, and an electron is injected into and evacuates from the floating gate electrode. The electron influences the threshold level of the field effect transistor. When the electron is injected into the floating gate, the injected electron raises the threshold level of the floating gate type field effect transistor.

Furthermore, non-volatile memory has high quality data retention requirements. Achieving the requirements of data retention is getting more difficult as process technology advances. In view of this, the present invention provides a device and method to meet the requirements.

BRIEF SUMMARY OF THE INVENTION

A detailed description is given in the following embodiments with reference to the accompanying drawings.

The present invention discloses a reference cell circuit which is applied to a non-volatile memory. The reference cell circuit includes a reference cell array, a first current mirror circuit, and a second current mirror circuit. The reference cell array includes at least one row of floating gate transistors. The first current mirror circuit is arranged to generate a mirror current according to a reference current generated by the reference cell array. The second current mirror circuit is arranged to receive the mirror current and generate an adjusted reference current according to the mirror current and a selected one of a plurality of enable signals, wherein the plurality of enable signals correspond to a plurality operations of the non-volatile memory and the adjusted reference current is arranged to determine logical state of a plurality of memory cells of the non-volatile memory.

Additionally, the present invention further discloses, a method of producing a reference current, which is applied to a reference cell circuit. The method includes: generating a reference current by a reference cell array including at least one row of floating gate transistors; mirroring the reference current, and generating a mirror current, accordingly; and mirroring the mirror current and generating an adjusted reference current, accordingly, according to a selected one of a plurality of enable signals, wherein the plurality of enable signals correspond to a plurality operations of a non-volatile memory and the adjusted reference current is arranged to determine logical state of a plurality of memory cells of the non-volatile memory.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
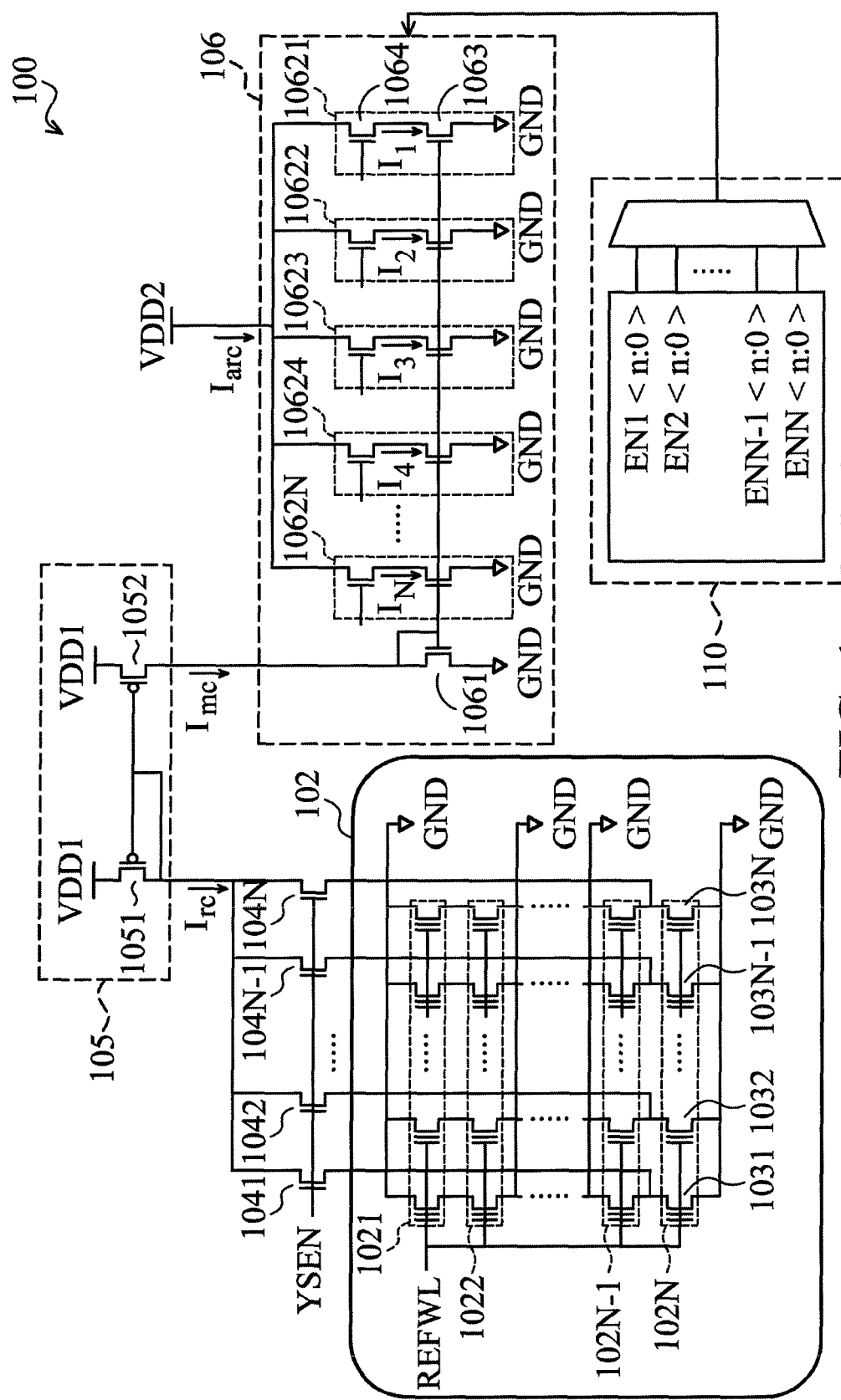
FIG. 1 is a schematic diagram illustrating an embodiment of a reference cell circuit of the present invention.

FIG. 1 is a schematic diagram illustrating an embodiment of a reference cell circuit of the present invention, wherein the reference cell circuit 100 is applied to a non-volatile memory (not shown) having a plurality of memory cells. The reference cell circuit 100 includes a reference cell array 102, a plurality of sensing transistors 1041~104N, a first current mirror circuit 105, a second current mirror circuit 106, and a selecting device 110.

The reference cell array 102 is arranged to generate a reference current Irc. The reference cell array 102 includes at least one row 1021-102N of floating gate transistors 1021-102N, wherein each row 1021-102N of floating gate transistors has a plurality of floating gate transistors 1031-103N. Each of the floating gate transistors 1031-103N has a first terminal coupled to the sensing transistors 1041~104N, respectively, a second terminal coupled to ground GND, and a gate terminal coupled to a reference word line REFWL. It should be noted that the reference cell array 102 is an ultraviolet threshold based reference cell. Namely, the floating gate transistors 1031-103N of the reference cell array 102 have a threshold voltage which is an ultraviolet threshold voltage. Since the reference cell array 102 is ultraviolet based, there is no program and erase related circuit required for the reference cell array 102, such that the circuit layout area is smaller and testing time is shorter than the traditional circuit. In another embodiment, the threshold voltage of the floating gate transistors 1031-103N of the reference cell array 102 have erased and programmed to a predetermined ultraviolet threshold voltage after the silicon wafer manufactured from the fabrication plant for semiconductor manufacture (FBA) to determine the reference level. In another embodiment, the reference cell array 102 have erased to the predetermined ultraviolet threshold voltage by the ultraviolet light. Furthermore, the voltage level of the floating gate transistors 1031-103N are programmed and erased to be close to the average ultraviolet threshold voltage, and the average ultraviolet threshold voltage is the predetermined ultraviolet threshold voltage. Therefore, the number of the floating gate transistors 1031-103N can be minimized. For example, the reference cell array 102 can only include four floating gate transistors 1031-1034, but it is not limited thereto.

The sensing transistors 1041~104N are coupled between the reference cell array 102 and the first current mirror circuit 105. Each of the sensing transistors 1041~104N has a first terminal coupled to each of the first terminal of the floating gate transistors 1031-103N of each row 1021-102N, respectively, a second terminal coupled to the first p-type transistor 1051, and a gate terminal coupled to a select enable line YSEN. It should be noted that the p-type transistors and n-type transistors of the present invention can be the p-type and n-type bipolar transistors, or the p-type and n-type field-effect transistors.

The first current mirror circuit 105 is arranged to generate a mirror current Imc according to the reference current Irc. The first current mirror circuit 105 includes a first p-type transistor 1051 and a second p-type transistor 1052. The first p-type transistor 1051 has a source terminal coupled to a voltage VDD1, a drain terminal coupled to the sensing transistors 1041~104N, and a gate terminal coupled to the drain terminal. The second p-type transistor 1052 has a source terminal coupled to the voltage VDD1, a drain terminal coupled to the drain terminal of the first n-type transistor 1061 of the second current mirror circuit 106, and a gate terminal coupled to the gate terminal of the first p-type transistor 1051.

It should be noted that the first p-type transistor 1051 has a width-to-length ratio (W/L), and the width-to-length ratio of the first p-type transistor 1051 is X times that of the width-to-length ratio of the floating gate transistors 1031-103N, wherein the X is the number of the floating gate transistors 1031-103N. For example, the width-to-length ratio of the first p-type transistor 1051 is 30 when the reference cell array 102 includes thirty floating gate transistors 1031-10330 and the width-to-length ratio of the floating gate transistors 1031-103N is 1, the width-to-length ratio of the first p-type transistor 1051 is 120 when the reference cell array 102 includes sixty floating gate transistors 1031-10360 and the width-to-length ratio of the floating gate transistors 1031-103N is 2, and so on. Furthermore, the second p-type transistor 1052 has the same width-to-length ratio (W/L) as the floating gate transistors 1031-103N, but it is not limited thereto.

The second current mirror circuit 106 is arranged to receive the mirror current Imc and generate an adjusted reference current Iarc according to the mirror current Imc and one of a plurality of enable signals EN1~ENN, wherein the plurality of enable signals EN1~ENN correspond to a plurality operations of the non-volatile memory and the adjusted reference current Iarc is arranged to determine the logical state of the memory cells of the non-volatile memory (not shown). The second current mirror circuit 106 includes the first n-type transistor 1061 and a plurality of control circuits 10621~4062N. The first n-type transistor 1061 has a drain terminal coupled to the drain terminal of the second p-type transistor 1052 of the first current mirror circuit 105, a source terminal coupled to the ground GND, and a gate terminal coupled to the source terminal. The control circuits 10621~1062N are arranged to mirror the mirror current Imc according to the enable signals EN1~ENN to generate at least one of the branch currents I1~IN, respectively, wherein the adjusted reference current Iarc is the sum of the generated branch current(s). Namely, the enable signals EN1~ENN is arranged to enable the control circuits 10621~1062N to generate the branch currents I1~IN, respectively. Each of the control circuits 10621~1062N includes a second n-type transistor 1063 and a third n-type transistor 1064. The second n-type transistor 1063 has a drain terminal coupled to the third n-type transistor 1064, a source terminal coupled to the ground GND, and a gate terminal coupled to the gate terminal of the first n-type transistor 1061. The third n-type transistor 1064 has a drain terminal coupled to the voltage VDD2, a source terminal coupled to the drain terminal of the second n-type transistor 1063, and a gate terminal arranged to receive one of the enable signals EN1~ENN. It should be noted that the voltage VDD2 is different from the voltage VDD1 in this embodiment. In another embodiment, the voltage VDD2 is the same as the voltage VDD1, but it is not limited thereto.

It should be noted that the first n-type transistor 1061 has a width-to-length ratio (W/L) which is 16 times that of the width-to-length ratio of the second n-type transistor 1063 in 10621 of the second current mirror circuit 106. Therefore, the accuracy of the adjusted reference current Iarc is 1/16 of Imc, but it is not limited thereto. For example, the accuracy of the adjusted reference current Iarc is 1/4 of Imc when the width-to-length ratio of the first n-type transistor 1061 is 4 times that of the width-to-length ratio of the second n-type transistor 1063 in 10621, the accuracy of the adjusted reference current Iarc is 1/8 of Imc when the width-to-length ratio of the first n-type transistor 1061 is 8 times that of the width-to-length ratio of the second n-type transistor 1063 in 10621, and so on.

Furthermore, each of the second n-type transistors 1063 of the control circuits 10621~1062N has a width-to-length ratio (W/L), and the width-to-length ratios of the second n-type transistors 1063 are different from each other by a power of two. For example, the width-to-length ratio of the second n-type transistor 1063 of the control circuit 10621 may be $2^0$, the width-to-length ratio of the second n-type transistor 1063 of control circuit 10622 may be $2^1$, the width-to-length ratio of the second n-type transistor 1063 of control circuit 10623 may be $2^2$, the width-to-length ratio of the second n-type transistor 1063 of control circuit 1062N may be $2^n$, and so on. It should be noted that the branch currents I1~IN are different from each other by a power of two due to the difference between the width-to-length ratios of the second n-type transistors 1063 of the control circuits 10621~1062N.

In this embodiment, each of the enable signals EN1~ENN is a binary code, and each of the bits <n:0> of the binary code is provided to each of the gate terminals of the third n-type transistors 1064 of the second current mirror circuit 106 to control conduction of each of the control circuits 10621~4062N, respectively, but it is not limited thereto. It should be noted that the operations of the non-volatile memory (not shown) include verifying low threshold voltage of the memory cells of the non-volatile memory, normal reading of the memory cells of the non-volatile memory, verifying high threshold voltage of the memory cells of the non-volatile memory, and verifying post program threshold voltage of the memory cells of the non-volatile memory, etc., but it is not limited thereto.

The selecting device 110 is arranged to select one of the enable signals EN1~ENN according to the operations of the non-volatile memory (not shown), and provide the selected enable signal to the second current mirror circuit 106. Namely, the selecting device 110 is arranged to select one of the enable signals EN1~ENN according to the operations of the non-volatile memory (not shown), and provide the selected enable signal to the gate terminals of the third n-type transistors 1064 of the control circuits 10621~1062N. For example, when the reference cell circuit 100 is enabled to produce the adjusted reference current Iarc, the selecting device 110 selects one of the enable signals EN1~ENN according to the operations of the non-volatile memory, the select enable line YSEN forces the sensing transistors 1041~104N to conduct, and the reference word line REFWL forces the floating gate transistors 1031-103N of the rows 1021-102N to conduct. Since that the reference cell array 102 produces the reference current Irc on the first p-type transistor 1051 of the first current mirror circuit 105, and the first current mirror circuit 105 mirrors the reference current Irc and produces the mirror current Imc on the second p-type transistor 1052, wherein the mirror current Imc is 1/X times that of the reference current Irc due to the difference between the width-to-length ratios of the first p-type transistor 1051 and second p-type transistor 1052. It should be noted that the X is the number of the floating gate transistors in 102. Next, the first n-type transistor 1061 of the second current mirror circuit 106 receives the mirror current Imc, and the second current mirror circuit 106 mirrors the mirror current Imc on the control circuit(s) which is/are enabled by the selected enable signal. Finally, the enabled control circuit(s) produce(s) the branch current(s), respectively, such that the adjusted reference current Iarc is produced on the second current mirror circuit 106.

Figure 2:
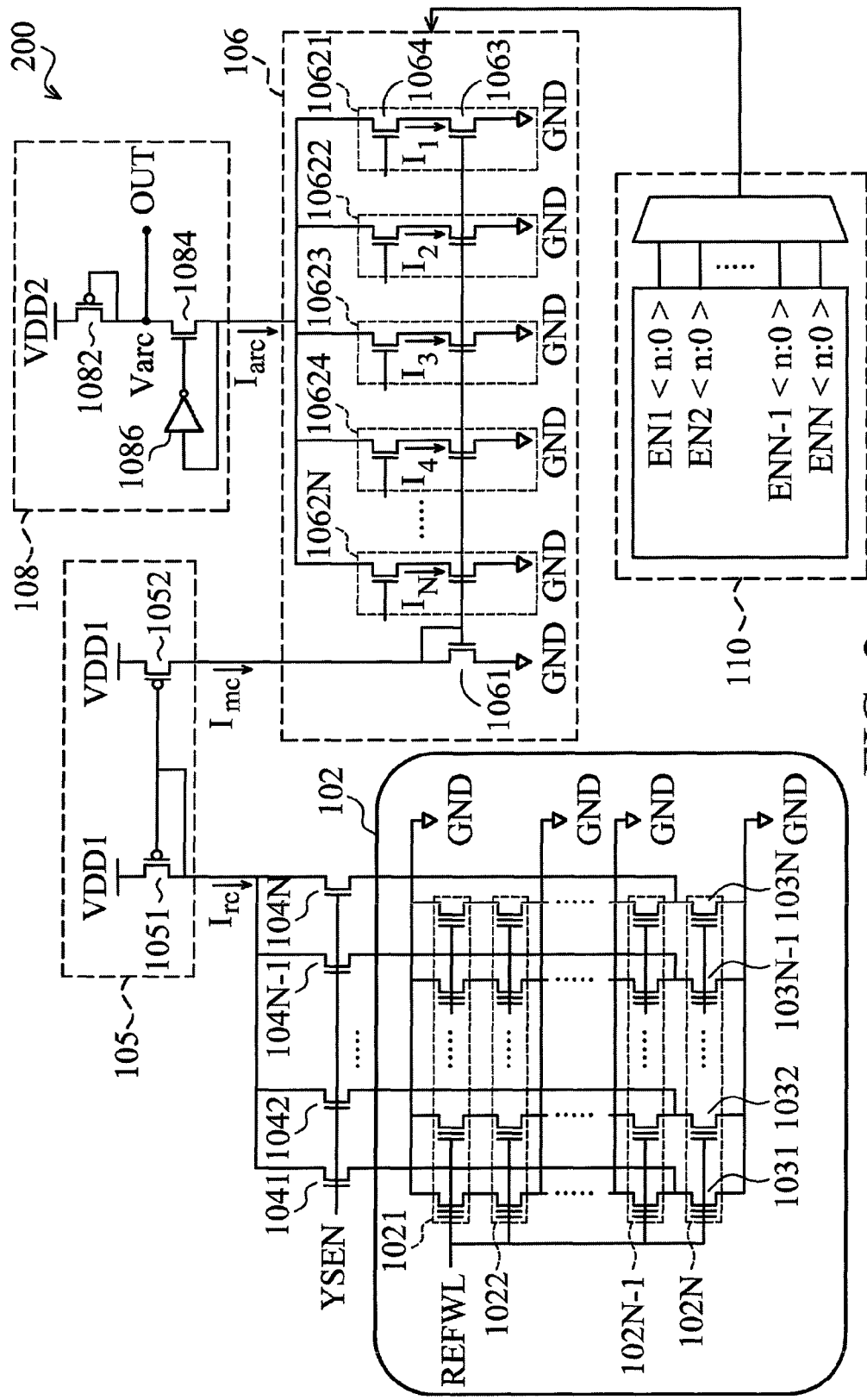
FIG. 2 is a schematic diagram illustrating another embodiment of a reference cell circuit of the present invention.

FIG. 2 is a schematic diagram illustrating another embodiment of a reference cell circuit of the present invention, wherein the reference cell circuit 200 is applied to a non-volatile memory (not shown) having a plurality of memory cells. The reference cell circuit 200 is similar to the reference cell circuit 100 of FIG. 1, except that the reference cell circuit 200 further includes a current-to-voltage converter 108.

The current-to-voltage converter 108 is arranged to convert the adjusted reference current Iarc to an adjusted reference voltage Varc, wherein the adjusted reference voltage Varc is applied on an output node OUT. The current-to-voltage converter 108 includes a p-type transistor 1082, an n-type transistor 1084, and an inverter 1086. The p-type transistor 1082 has a source terminal coupled to the voltage VDD2, a drain terminal coupled to the output node OUT, and a gate terminal coupled to the drain terminal. It should be noted that the voltage VDD2 is different from the voltage VDD1 in this embodiment. In another embodiment, the voltage VDD2 is the same as the voltage VDD1, but it is not limited thereto. The n-type transistor 1084 has a drain terminal coupled to the drain terminal of the p-type transistor 1082, a source terminal coupled to the second current mirror circuit 106, and a gate terminal coupled to the inverter 1086. The inverter 1086 has an input terminal coupled to the source terminal of the n-type transistor 1084, and an output terminal coupled to the gate terminal of the n-type transistor 1084.

In this embodiment, when the reference cell circuit 200 is enabled to produce the adjusted reference voltage Varc, the selecting device 110 selects one of the enable signals EN1~ENN according to the operations of the non-volatile memory, the select enable line YSEN forces the sensing transistors 1041~104N to conduct, and the reference word line REFWL forces the floating gate transistors 1031-103N of rows 1021-102N to conduct. Since that the reference cell array 102 produces the reference current Irc on the first p-type transistor 1051 of the first current mirror circuit 105, and the first current mirror circuit 105 mirrors the reference current Irc and produces the mirror current Imc on the second p-type transistor 1052, wherein the mirror current Imc is 1/X times that of the reference current Irc due to the difference between the width-to-length ratios of the first p-type transistor 1051 and second p-type transistor 1052. It should be noted that the X is the number of the floating gate transistors in 102. Next, the first n-type transistor 1061 of the second current mirror circuit 106 receives the mirror current Imc, and the second current mirror circuit 106 mirrors the mirror current Imc on the control circuit(s) which is/are enabled by the selected enable signal. The enabled control circuit(s) produce(s) the branch current(s), respectively, such that the adjusted reference current Iarc is produced on the current-to-voltage converter 108. Finally, the current-to-voltage converter 108 converts the adjusted reference current Iarc to the adjusted reference voltage Varc on the output node OUT.

Figure 3:
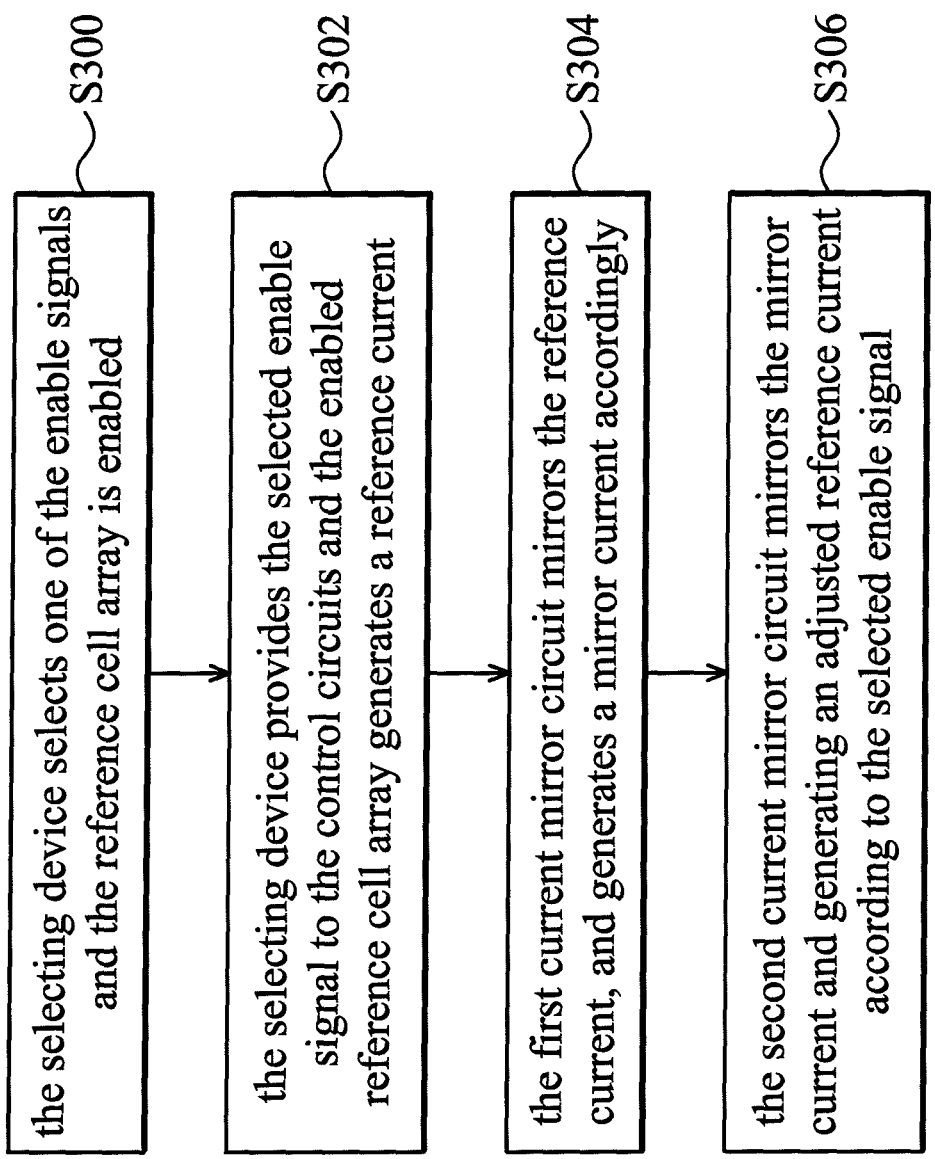
FIG. 3 is a flowchart of a method of producing a reference current according to an embodiment of the present invention.

FIG. 3 is a flowchart of an embodiment of a method of producing a reference current of the present invention, wherein the method of producing a reference current is applied to the reference cell circuit 100 of FIG. 1. The process starts at step S300.

In the step 300, the selecting device 110 selects one of the enable signals EN1~ENN according to a plurality operations of a non-volatile memory (not shown) and the reference cell array 102, which includes at least one row 1021-102N of the floating gate transistors, is enabled by the select enable line YSEN and reference word line REFWL when the reference cell circuit 200 is enabled to produce the adjusted reference current Iarc, wherein the plurality of enable signals EN1~ENN correspond to a plurality operations of the non-volatile memory which has a plurality of memory cells. The operations include verifying low threshold voltage of the memory cells of the non-volatile memory, normal reading of the memory cells of the non-volatile memory, verifying high threshold voltage of the memory cells of the non-volatile memory, verifying post program threshold voltage of the memory cells of the non-volatile memory, etc., but it is not limited thereto.

Next, in the step S302, the selecting device 110 provides the selected enable signal to the control circuits 10621~1062N. It should be noted that each of the enable signals EN1~ENN is a binary code, and each of the bits <n:0> of the binary code is provided to each of the control circuits 10621~1062N to control conduction of the control circuits 10621~1062N, respectively. Furthermore, the enabled reference cell array 102 generates a reference current Irc, wherein the floating gate transistors 1031-103N of the reference cell array 102 have a threshold voltage which is an ultraviolet threshold voltage. In another embodiment, the threshold voltage of the floating gate transistors 1031-103N of the reference cell array 102 have erased and programmed to a predetermined ultraviolet threshold voltage after the silicon wafer manufactured from the fabrication plant for semiconductor manufacture (FBA) to determine the reference level. Furthermore, the threshold voltage level of the floating gate transistors 1031-103N are programmed and erased to be close to the average ultraviolet threshold voltage. Therefore, the number of the floating gate transistors 1031-103N can be minimized. For example, the reference cell array 102 can only include four floating gate transistors 1031-1034, but it is not limited thereto.

Next, in the step S304, the first current mirror circuit 105 mirrors the reference current Irc, and generates a mirror current Imc, accordingly. It should be noted that the mirror current Imc is 1/X times that of the reference current Irc due to the difference between the width-to-length ratios of the first p-type transistor 1051 and second p-type transistor 1052 of the first current mirror circuit 105. The X is the number of the floating gate transistors in 102.

Next, in the step S306, according to the selected enable signal, the second current mirror circuit 106 mirrors the mirror current Imc and generates an adjusted reference current Iarc, accordingly, wherein the adjusted reference current Iarc is arranged to determine a logical state of a plurality of memory cells of the non-volatile memory (not shown). The step of mirroring the mirror current Imc further includes enabling at least one of a plurality of control circuits 10621~1062N according to the one of the enable signals EN1~ENN, mirroring the mirror current Imc to the enabled control circuit(s), and generating at least one of the branch currents I1~IN by the enabled control circuit(s). The process ends at the step S306. It should be noted that the adjusted reference current Iarc is the sum of the branch currents I1~IN, wherein the branch currents I1~IN are different from each other by a power of two due to the difference between the width-to-length ratios of the second n-type transistors 1063 of control circuits 10621~1062N. For example, each of the second n-type transistors 1063 of the control circuits 1062₁~1062N has a width-to-length ratio (W/L), and the width-to-length ratios of the second n-type transistors 1063 are different from each other by a power of two. For example, the width-to-length ratio of the second n-type transistor 1063 of control circuit 1062₁ may be $2^0$, the width-to-length ratio of the second n-type transistors 1063 of control circuit 1062₂ may be $2^1$, the width-to-length ratio of the second n-type transistor 1063 of control circuit 1062₃ may be $2^2$, the width-to-length ratio of the second n-type transistor 1063 of control circuit 1062N may be $2^n$, and so on.

Figure 4:
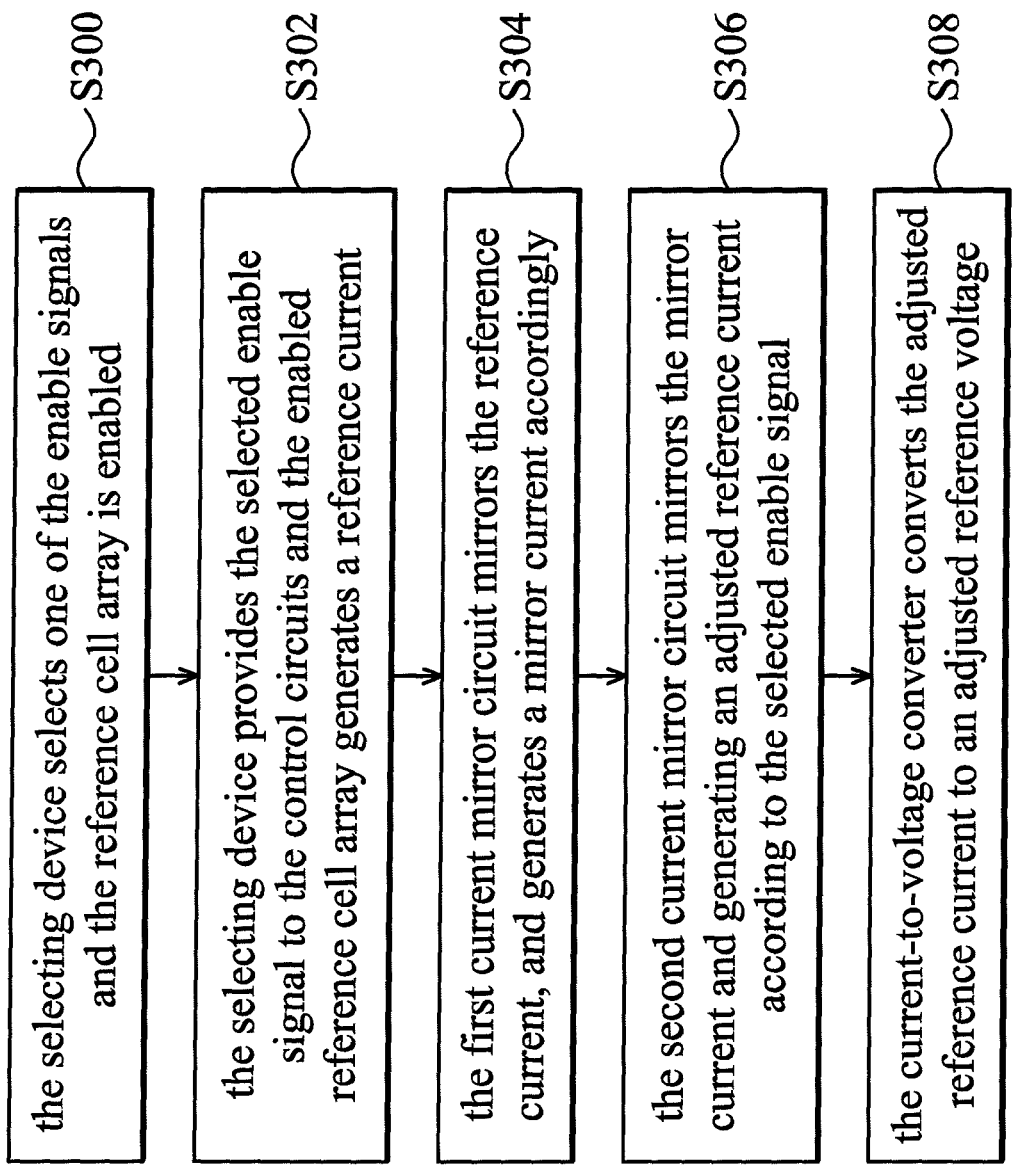
FIG. 4 is a flowchart of another method of producing a reference current according to an embodiment of the present invention.

FIG. 4 is a flowchart of another embodiment of a method of producing a reference current of the present invention, wherein the method of producing a reference current is applied to the reference cell circuit 200 of FIG. 1. The method of producing a reference current of FIG. 4 is similar to the method of FIG. 3, except that the method of producing a reference current of FIG. 4 further includes the step S308.

In the step S308, the current-to-voltage converter 108 converts the adjusted reference current Iarc to an adjusted reference voltage Varc. The process ends at the step S308.

The reference cell circuits 100 and 200, and method of producing a reference current can provide the adjusted reference current Iarc to the memory cell, and decrease the layout area. Furthermore, the reference cell circuits 100 and 200 is an ultraviolet threshold based reference cell, such that the ultraviolet erased threshold state has no free electrons in the floating gate. Therefore, the reference cell circuits 100 and 200 have a better stability of data retention.

While the exemplary embodiments have been described by way of example and in terms of the preferred embodiments, it is to be understood that the exemplary embodiments are not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A reference cell circuit, applied to a non-volatile memory, comprising:
    a reference cell array, comprising at least one row of floating gate transistors, and arranged to generate a reference current;
    a first current mirror circuit, arranged to generate a mirror current according to the reference current generated by the reference cell array; and
    a second current mirror circuit, arranged to receive the mirror current and generate an adjusted reference current according to the mirror current and a selected one of a plurality of enable signals, wherein the plurality of enable signals correspond to a plurality operations of the non-volatile memory and the adjusted reference current is arranged to determine logical state of a plurality of memory cells of the non-volatile memory.

2. The reference cell circuit as claimed in claim 1, wherein the second current mirror circuit further comprises:
    a first n-type transistor, having a drain terminal coupled to the first current mirror circuit, a source terminal coupled to a ground, and a gate terminal coupled to the source terminal; and
    a plurality of control circuits, arranged to mirror the mirror current according to the selected enable signal, wherein each of the control circuits comprises:
    a second n-type transistor, having a drain terminal, a source terminal coupled to the ground, and a gate terminal coupled to the gate terminal of the first n-type transistor; and
    a third n-type transistor, having a drain terminal coupled to a first voltage, a source terminal coupled to the drain terminal of the second n-type transistor, and a gate terminal arranged to receive the selected enable signal.

3. The reference cell circuit as claimed in claim 2, wherein each of the second n-type transistors has a width-to-length ratio, and the width-to-length ratios of the second n-type transistors are different from each other by a power of two.

4. The reference cell circuit as claimed in claim 2, further comprising a plurality of sensing transistors coupled between the reference cell array and the first current mirror circuit, wherein each of the sensing transistors is coupled to each of the floating gate transistors in each row, respectively.

5. The reference cell circuit as claimed in claim 4, wherein the first current mirror circuit further comprises:
    a first p-type transistor, having a source terminal coupled to a second voltage, a drain terminal coupled to each of the sensing transistors, and a gate terminal coupled to the drain terminal; and
    a second p-type transistor, having a source terminal coupled to the second voltage, a drain terminal coupled to the drain terminal of the first n-type transistor of the second current mirror circuit, and a gate terminal coupled to the gate terminal of the first p-type transistor.

6. The reference cell circuit as claimed in claim 1, further comprising a selecting device arranged to select the one of the plurality of enable signals according to the operations of the non-volatile memory, and provide the selected enable signal to the second current mirror circuit.

7. The reference cell circuit as claimed in claim 2, wherein each of the enable signals is a binary code, and each of bits of the binary code is provided to the gate terminal of a corresponding one of the third n-type transistors to control conduction of each of the control circuits, respectively.

8. The reference cell circuit as claimed in claim 1, wherein the operations comprise verifying a low threshold voltage of the memory cells of the non-volatile memory, normal reading of the memory cells of the non-volatile memory, verifying a high threshold voltage of the memory cells of the non-volatile memory, and verifying a post program threshold voltage of the memory cells of the non-volatile memory.

9. The reference cell circuit as claimed in claim 1, wherein the floating gate transistors of the reference cell array have a threshold voltage which is an ultraviolet threshold voltage.

10. The reference cell circuit as claimed in claim 1, wherein the floating gate transistors of the reference cell array have a threshold voltage, and the threshold voltage of the floating gate transistors of the reference cell array has erased and programmed to a predetermined ultraviolet threshold voltage or erased to ultraviolet threshold voltage by ultraviolet light.

11. The reference cell circuit as claimed in claim 1, further comprising a current-to-voltage converter arranged to convert the adjusted reference current to an adjusted reference voltage.

12. The reference cell circuit as claimed in claim 11, wherein the current-to-voltage converter comprises:
    a p-type transistor, having a source terminal coupled to a voltage, a drain terminal coupled to an output node, and a gate terminal coupled to the drain terminal of the p-type transistor; and
    an n-type transistor, having a drain terminal coupled to the drain terminal of the p-type transistor, a source terminal coupled to the second current mirror circuit, and a gate terminal; and
    an inverter, having an input terminal coupled to the source terminal of the n-type transistor, and an output terminal coupled to the gate terminal of the n-type transistor.

13. A method of producing a reference current, applied to a reference cell circuit, comprising:
  generating a reference current by a reference cell array comprising at least one row of floating gate transistors;
  mirroring the reference current, and generating a mirror current, accordingly; and
  mirroring the mirror current and generating an adjusted reference current, accordingly, according to a selected one of a plurality of enable signals, wherein the plurality of enable signals correspond to a plurality operations of a non-volatile memory and the adjusted reference current is arranged to determine logical state of a plurality of memory cells of the non-volatile memory.

14. The method as claimed in claim 13, wherein the step of mirroring the mirror current further comprises:
  enabling at least one of a plurality of control circuits according to the selected enable signal; and
  mirroring the mirror current to the enabled control circuit(s), and generating at least one of branch urrent(s) by the enabled control circuit(s), wherein the adjusted reference current is sum of the branch current(s).

15. The method as claimed in claim 14, wherein the branch currents are different from each other by a power of two.

16. The method as claimed in claim 14, further comprising:
  selecting the one of the plurality of enable signals according to the operations of the non-volatile memory; and
  providing the selected enable signal to the control circuits.

17. The method as claimed in claim 14, wherein each of the enable signals is a binary code, and each of bits of the binary code is provided to each of the control circuits to control conduction of the control circuits, respectively.

18. The method as claimed in claim 13, wherein the operations comprise verifying a low threshold voltage of the memory cells of the non-volatile memory, normal reading of the memory cells of the non-volatile memory, verifying a high threshold voltage of the memory cells of the non-volatile memory, and verifying a post program threshold voltage of the memory cells of the non-volatile memory.

19. The method as claimed in claim 13, wherein the floating gate transistors of the reference cell array have a threshold voltage which is an ultraviolet threshold voltage.

20. The method as claimed in claim 19, wherein the floating gate transistors of the reference cell array have a threshold voltage, and the threshold voltage of the memory cells of the floating gate transistors of the reference cell array have erased and programmed to a predetermined ultraviolet threshold voltage or erased to ultraviolet threshold voltage by ultraviolet light.

21. The method as claimed in claim 13, further comprising converting the adjusted reference current to an adjusted reference voltage.

* * * * *